United States Patent [19]

Ashida

[11] 4,442,415

[45] Apr. 10, 1984

[54] MULTICHANNEL FREQUENCY MODULATOR

[75] Inventor: Shigeaki Ashida, Tokyo, Japan

[73] Assignee: Nippon Electric Co., Ltd., Tokyo, Japan

[21] Appl. No.: 168,583

[22] Filed: Jul. 14, 1980

[30] Foreign Application Priority Data

Jul. 20, 1979 [JP] Japan .................................. 54-99294

[51] Int. Cl.³ ............................................. H03C 3/22
[52] U.S. Cl. ............................... 332/16 T; 331/116 R; 331/161; 331/177 V; 331/179; 332/26; 332/30 V
[58] Field of Search ...................... 332/16 T, 26, 30 V; 331/116 R, 161, 179, 177 V; 455/77, 113

[56] References Cited

U.S. PATENT DOCUMENTS

| | | | |
|---|---|---|---|
| 3,579,281 | 5/1971 | Kam et al. .................. | 331/177 V X |
| 3,581,240 | 5/1971 | Enderby ....................... | 332/30 V X |
| 3,631,364 | 12/1971 | Schilb et al. ................. | 332/30 V X |
| 3,974,452 | 8/1976 | Cunningham ................. | 455/158 |
| 4,055,822 | 10/1977 | Rinderle ...................... | 331/177 V X |

OTHER PUBLICATIONS

Motorola Service Manual No. 68P81071A90 for "Handie-Com," MH70 Series FM Radio, 1-11-72, pp. 8-10.

Primary Examiner—Siegfried H. Grimm
Attorney, Agent, or Firm—Laff, Whitesel, Conte & Saret

[57] ABSTRACT

A single Colpitts-type oscillator has a plurality (here, three) of optional inputs, each having a separate oscillating circuit individually associated therewith. By suitably applying a potential to a selected one of the oscillating circuits, the oscillator may be made to produce one of a plurality of predetermined carrier wave frequencies. The inventive circuit configuration eliminates large volume components such as coupling capacitors and enables hybrid IC construction, which miniaturizes the circuit. The circuit is particularly useful in walkie-talkie FM transceivers.

16 Claims, 3 Drawing Figures

MULTICHANNEL FREQUENCY MODULATOR

The present invention relates to a multifrequency oscillator and, more particularly, to an oscillator for use as a source of carrier waves in a multichannel frequency modulator, especially—although not exclusively—for use in a walkie-talkie transceiver.

U.S. Pat. No. 3,974,452 shows a conventional multifrequency oscillator which employs a plurality of piezoelectric resonators, such as crystal resonators, coupled into a single oscillation circuit. In operation, one of those resonators is selectively actuated to provide a particular oscillating frequency which is proper for the selected resonator.

A multichannel crystal controlled, frequency modulator, using such an oscillator, has also been known. Reference is made, for example, to a "HANDIE-COM" MH 70 SERIES FM RADIO which is manufactured and sold by Motorola Inc., and described in its Service Manual 68P81071A90, Issue O, published by the Communication Division of Ft. Lauderdale, Fla. In the "HANDIE-COM" modulator, a crystal controlled oscillating circuit contains a voltage variable reactance element, such as a varactor diode. The resulting oscillating wave form is frequency-modulated or frequency-deviated by changing a load capacitance, as viewed from the crystal resonator, responsive to a change in the applied voltages (e.g., a modulating signal or a bias voltage).

In this "HANDIE-COM" modulator, the reactance of the oscillating circuit is not fixed for the frequencies which are proper for the respective crystal resonators. The standard frequencies and the capacitance ratios of the crystal resonators are not uniform. This non-uniformity is inevitably produced as a result of manufacturing differences. Also, capacitance of the varactor diode is not invariable, when it is reversely biased. The resulting variations also give rise to great variations in the oscillating frequencies and to the modulation sensitivities of the respective channels.

Accordingly, the oscillating frequenices and the modulation sensitivities must be adjusted to become fixed values. To this end, each channel includes a variable inductance for adjusting the carrier wave oscillating frequency in that channel. A variable voltage divider is also provided to change the modulation input signal level, as it is supplied to varactor diodes for adjusting the modulation sensitivity. Additionally, the DC bias voltages are applied through resistors to individually associated varactor diodes. To prevent a division of the DC bias voltages by the voltage divider, bypass capacitors are provided between each of the variable voltage dividers and the varactor diode associated therewith.

The "HANDI-COM" modulator is capable of independently adjusting the oscillating frequencies and the modulation sensitivities of the respective channels. However, it requires a very large number of parts, especially bulky parts occupying a large space, such as bypass capacitors, for example. In this respect, it is difficult to make the modulator smaller or to manufacture it in the form of a hybrid IC.

Accordingly, an object of the invention is to provide a small size multichannel frequency modulator, without any loss of the frequency stability.

According to one aspect of the invention, a multichannel frequency modulator frequency-modulates the outputs of any selected one of a plurality of oscillator circuits. A modulating signal is applied to an input terminal and a frequency-modulated signal is taken from the output terminal. The multichannel frequency modulator includes an oscillator circuit which is coupled to the output terminal. In order to provide any given one of many frequencies, a plurality of resonators are selectively coupled to the oscillator circuit and a plurality of varactors are resepectively coupled with the resonators. A plurality of individual voltage-dividing resistors coupled to the input terminal to the oscillator, apply both a bias voltage and the modulating signal to the varactors, while substantially attenuating the components of the carrier wave frequencies.

The invention will now be described with reference to the accompanying drawings, in which.

Figure 1:
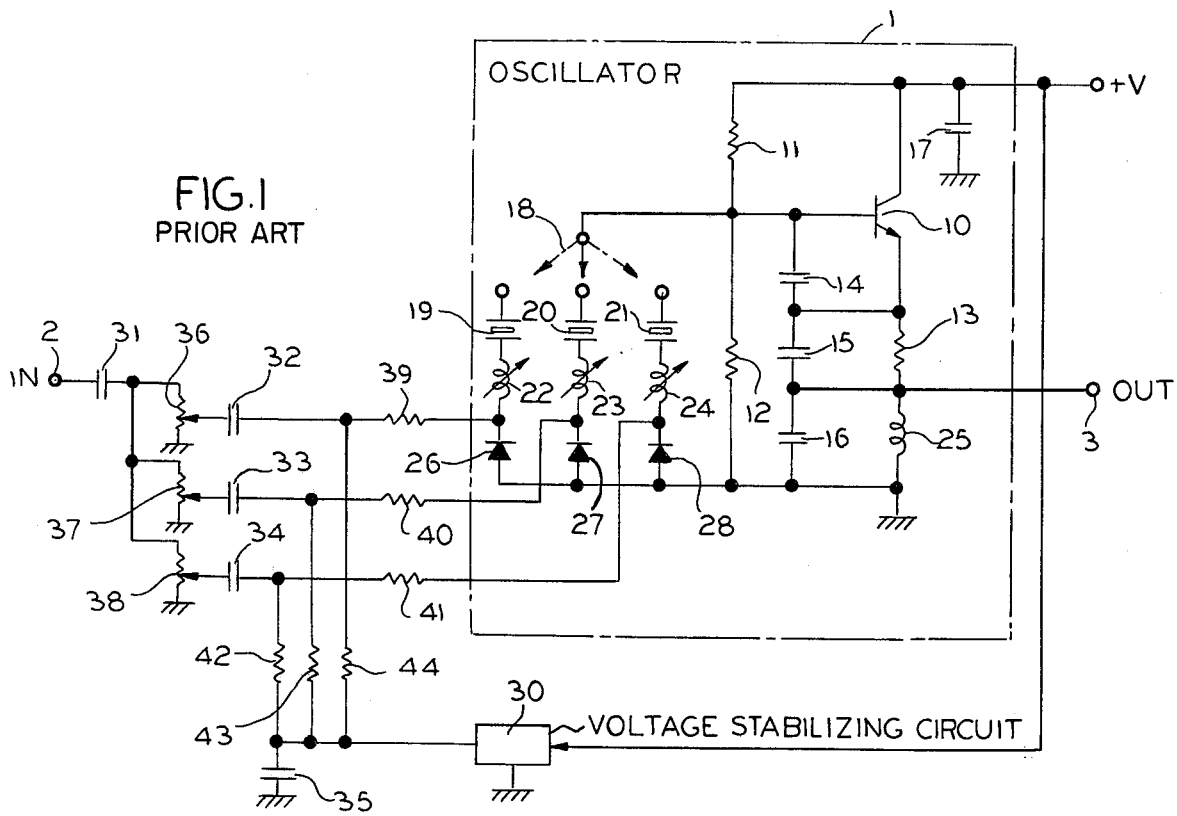
FIG. 1 is a circuit diagram showing a conventional three-channel frequency modulator.

In FIG. 1, a three-channel, Colpitts-type, crystal-controlled oscillator circuit uses a transistor coupled in a common collector configuration. The carrier wave oscillator circuit 1 is composed of a transistor 10, bias voltage resistors 11 and 12, a bias current resistor 13, capacitors 14 and 16, bypass capacitors 15 and 17, a channel-selecting switch 18, crystal resonators 19 to 21, variable inductances 22 to 24, a coil 25 and varactor diodes 26 to 28. Thus, there are three separate oscillating circuits (e.g., one oscillating circuit includes crystal 20, inductor 23, and varactor diode 27), each tuned to a separate frequency.

Channel selection is made by the switch 18 which selectively connects any one of the crystal resonators 19 to 21, having a particular fundamental frequency, into the associated oscillating circuit. The oscillator circuit 1 oscillates at a carrier frequency which is three times the fundamental frequency of the associated crystal resonator 19 to 21, that is, in the third overtone mode. The resulting carrier wave oscillation is modulated by a signal which is applied to the cathode of the active one of the varactor diodes 26 to 28. The capacitance of that varactor is varied by the modulating signal. The modulated carrier wave signal appears at the output terminal 3.

A voltage-stabilizing circuit 30 applies a DC bias voltage through resistors 42 to 44 and 39 to 41, respectively, to the varactor diodes 26 to 28. An example of such a stabilizing circuit is designated $\mu$PC 78L08 and is manufactured in Japan by NEC (Nippon Electric Co., Ltd.). The modulating signal appears at an input terminal 2, and is applied through a bypass capacitor 31 and variable voltage-dividing resistors 36 to 38, where its voltage is properly divided. The modulating voltage-divided signals are taken from the midpoint variable potential contacts of these voltage dividers and applied through bypass capacitors 32 to 34 and the resistors 39 to 41, to the varactor diodes 26 to 28, respectively. Thus, these signals modulate the oscillating carrier wave frequencies.

The variable inductances 22 to 24 are used for adjusting the carrier wave frequencies, to become the desired carrier frequencies of the individual channels. The variable voltage dividers 36 to 38, respectively, adjust the modulation sensitivities of the channels to become the desired sensitivities. The bypass capacitors 32 to 34 pass the modulating signal, but do not pass the output from the voltage-stabilizing circuit 30 through voltage-dividing resistors 42 to 44 to the variable voltage dividers 36 to 38.

The resistors 39 to 41 prevent the oscillating frequency component of the oscillator circuit 1 from leaking to the variable voltage dividers 36 to 38 or to the voltage-stabilizing circuit 30. Hence, these resistors may be replaced by choke coils. A de-coupling capacitor 35 is provided for reducing and smoothing ripples in the voltage.

If the power source voltage +V is sufficiently stable, the voltage-stabilizing circuit 30 may be omitted. If circuit 30 is not used, the power source voltage may be voltage-divided by bleeder resistors and then applied to the resistors 42 to 44.

The disadvantages of the FIG. 1 modulator is that a large number of parts is required. In particular, many of these parts have a large volume, such as bypass capacitors 32 to 34, at least one of which must be provided for each of the corresponding channels. This brings about a difficulty in making small-sized frequency modulators and in fabricating the frequency modulator into hybrid IC's.

Figure 2:
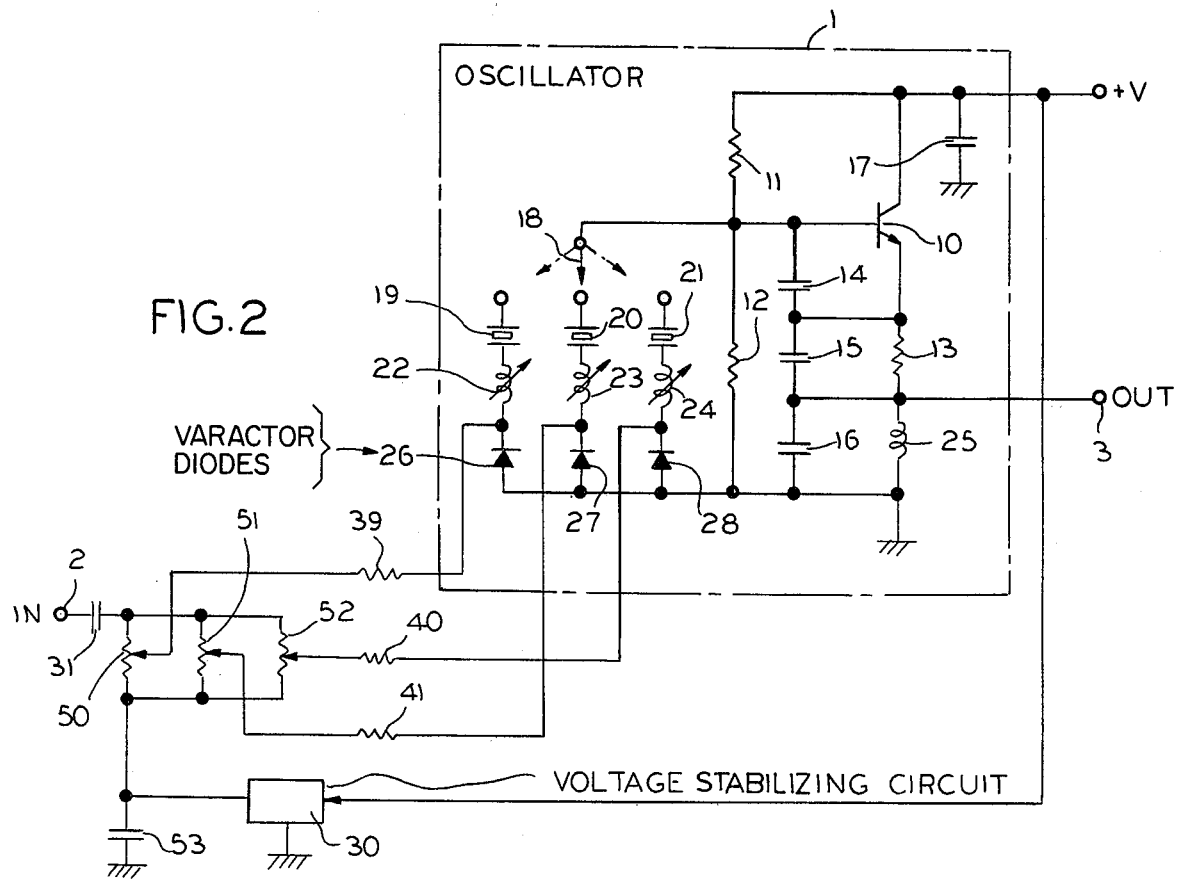
FIG. 2 is a circuit diagram showing an embodiment of a three-channel frequency modulator, according to the invention.

According to the present invention, an embodiment (FIG. 2) of the multichannel frequency modulator eliminates the above-mentioned disadvantages. FIG. 2 uses the same reference symbols that are used in FIG. 1 to designate like or equivalent parts. Therefore, the following description will proceed, by placing an emphasis on those portions of FIG. 2 which are different from the circuit shown in FIG. 1.

The output from the voltage-stabilizing circuit 30 is an inverse DC bias voltage applied through the midpoint variable potential terminals on voltage dividers 50 to 52 and the resistors 39 to 41 to the cathodes of the varactor diodes 26 to 28. The modulating input signal appears at the input terminal 2, passes through the capacitor 31, one end of each of the variable voltage dividers 50 to 52, and de-coupling capacitor 53 to ground. The resulting divided voltage signals are the modulating signals applied to the cathodes of the varactor diodes 26 to 28. The de-coupling capacitor 53 not only smoothes and reduces the ripple voltage (as the capacitor 35 FIG. 1 did), but also bypasses the input modulating signal.

As described above, the output from the voltage-stabilizing circuit 30 is applied through the variable voltage dividing resistors 50 to 52 to the varactor diodes 26 to 28. (Recall that this output did not pass through the resistors 36 to 38 in FIG. 1.) Therefore, the circuit of FIG. 2 does not require the bypass capacitors 32 to 34 and the resistors 42 to 44, which are used for isolation in the circuit of FIG. 1.

Figure 3:
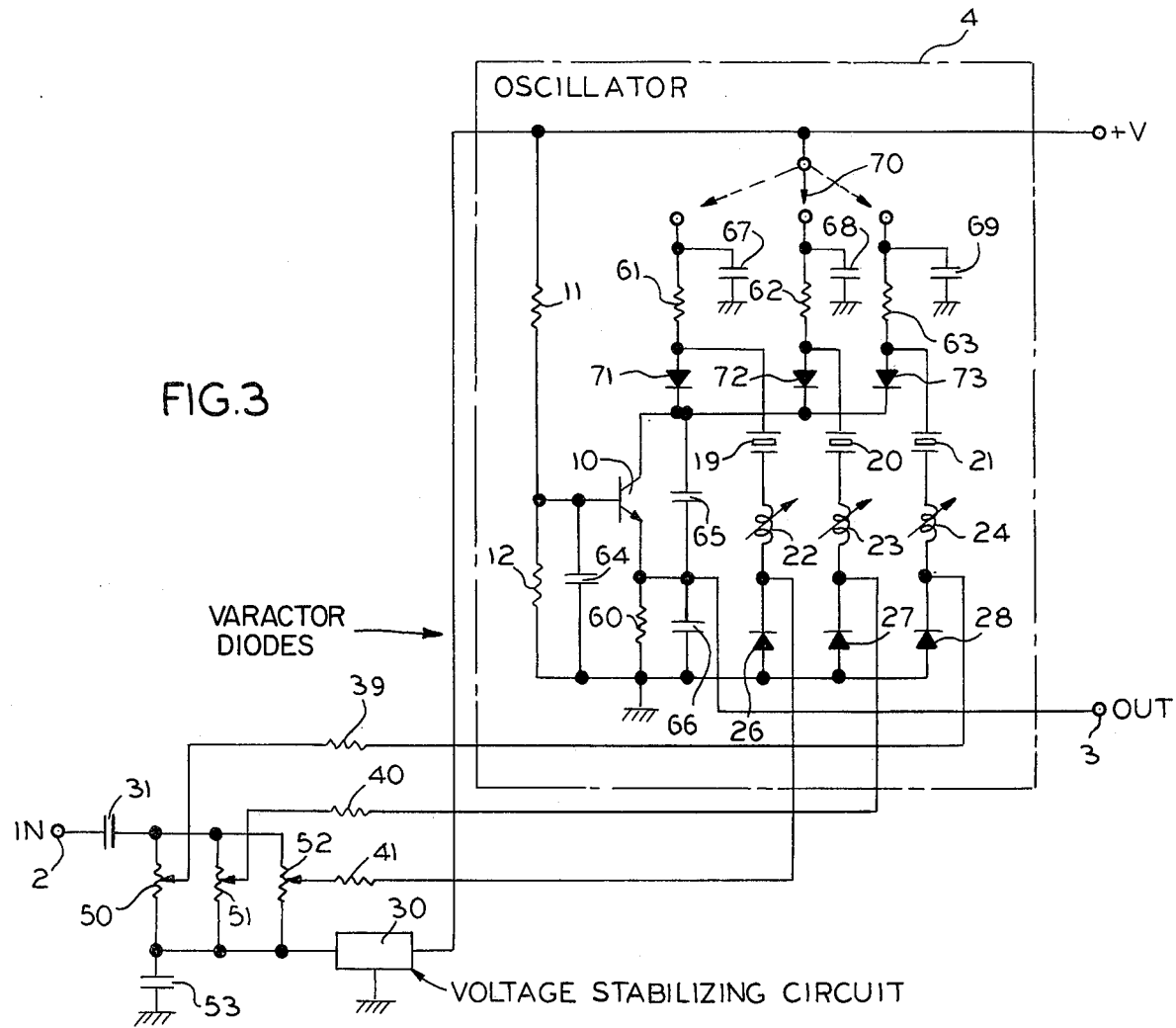
FIG. 3 is a circuit diagram showing another embodiment of the three-channel frequency modulator, according to the invention.

According to another embodiment of the present invention, the multichannel frequency modulator may be constructed as shown in FIG. 3. Again, the same reference numerals are used to designate similar parts in FIGS. 1, 2 and 3.

The carrier wave generating circuit, oscillator 4, includes a transistor 10, used in a common base configuration, as a third overtone, Colpitts oscillator circuit. The rest of the oscillator circuit 4 comprises bias voltage resistors 11 and 12, crystal resonators 19 to 21, the variable inductances 22 to 24, varactor diodes 26 to 28, bias current resistors 60 to 63, feedback capacitors 65 and 66, bypass capacitors 67 to 69, a channel selecting switch 70, and switching diodes 71 to 73.

Assume now that the channel selecting switch 70 is positioned on its central terminal, as indicated by a solid line in FIG. 3. Then, the diode 72 is conductive. As a result, an oscillating circuit is formed by completing a circuit through the crystal resonator 20, the variable inductance 23 and the varactor diode 27, to the transistor 10.

The modulating signal appearing on input terminal 2 is applied to the active circuit including crystal 20 by way of the coupling capacitors 31 and 53, variable voltage divider 51, and resistor 40, to the cathode of varactor diode 27. The frequency modulated output signal is produced at the output terminal 3.

The crystal resonators used in the above-mentioned embodiments may be replaced by other suitable piezoelectric resonators, such as ceramic resonators, for example.

As seen from the foregoing description, the inventive circuit construction reduces the number of parts, and particularly the number of large-sized parts, such as bypass capacitors. This makes it easy to manufacture the frequency modulator in the form of a hybrid IC, and to miniaturize the frequency modulator and, therefore, the apparatus as a whole.

What is claimed is:

1. A multichannel frequency modulator, having input and output terminals, which selectively frequency-modulates any of a plurality of carrier wave frequencies responsive to a modulating signal applied to said input terminal and provides a frequency-modulated signal at said output terminal, said multichannel frequency modulator comprising:
   oscillator means coupled to said output terminal;
   a plurality of resonator means selectively coupled to said oscillator means;
   a plurality of varactor means individually associated with said resonator means;
   a plurality of voltage dividing resistors each having first, second and third terminals;
   first means for coupling said input terminal to each of said first terminals;
   second means for applying a bias voltage to each of said second terminals; and
   a plurality of third means coupled between individually associated ones of said third terminals and said varactor means for applying said modulating signal to said varactor means, said third means substantially attenuating the oscillating frequency components from said oscillator means.

2. A multichannel frequency modulator as claimed in claim 1, wherein said first means is a capacitor.

3. A multichannel frequency modulator as claimed in claims 1 or 2, wherein said second means includes a voltage-stabilizing circuit.

4. A multichannel frequency modulator as claimed in claim 1 or 2, wherein said first means further includes another capacitor connected between said second terminal and a predetermined potential point.

5. A multichannel frequency modulator as claimed in claim 4, wherein each of said third means is a resistor.

6. A multichannel frequency modulator as claimed in claim 4, wherein said second means includes a voltage-stabilizing circuit.

7. A multichannel frequency modulator as claimed in claim 6, wherein said plurality of resonator means are crystal resonators.

8. A multichannel frequency modulator as claimed in claim 6, wherein each of said third means is a resistor.

9. A multichannel frequency modulator as claimed in claim 4, wherein each of said resonator means is a crystal resonator.

10. A multichannel frequency modulator as claimed in claim 1 or 2, wherein each of said resonator means is a crystal resonator.

11. A multichannel frequency modulator as claimed in claim 10, wherein each of said third means is a resistor.

12. A multichannel frequency modulator as claimed in claim 1 or 2, wherein each of said third means is a resistor.

13. An FM modulator-oscillator combination for use in a walkie-talkie, said modulator comprising oscillator means having a plurality of separate oscillating circuits associated therewith, means for biasing each of said oscillating circuits from an individually associated midpoint variable potential terminal on a voltage-dividing resistor, each of said oscillating circuits tuning said oscillator means to a separate carrier wave frequency, a source of modulating signals coupled directly to one end of each of said voltage-dividing resistors, and a stabilized voltage source means coupled directly to the other end of each of said voltage-dividing resistors.

14. The circuit of claim 13 wherein each of said oscillating circuits includes at least a resonator in a series circuit with a varactor, said individually associated variable potential terminal being coupled via a nonreactive impedance directly to a point in said series circuit which is between said resonator and said varactor.

15. The circuit of either of the claims 13 or 14 and decoupling means associated with the coupling between said source means and said other ends of said voltage-dividing resistors for removing ripples and smoothing said stabilized voltage.

16. The circuit of claim 15 and a coupling capacitor connected between said source of modulating signals and said one ends of said voltage dividing resistors.

* * * * *